US006972256B2

(12) United States Patent
Fukunaga et al.

(10) Patent No.: US 6,972,256 B2
(45) Date of Patent: Dec. 6, 2005

(54) METHOD AND APPARATUS FOR FORMING THIN FILM OF METAL

(75) Inventors: Akira Fukunaga, Tokyo (JP); Kuniaki Horie, Tokyo (JP); Naoaki Ogure, Tokyo (JP); Takao Kato, Tokyo (JP); Hiroshi Nagasawa, Tokyo (JP); Shinji Kajita, Tokyo (JP); Makoto Kubota, Tokyo (JP)

(73) Assignee: Ebara Corporation, Tokyo (JP)

( * ) Notice: Subject to any disclaimer, the term of this patent is extended or adjusted under 35 U.S.C. 154(b) by 709 days.

(21) Appl. No.: 09/890,330

(22) PCT Filed: Nov. 29, 2000

(86) PCT No.: PCT/JP00/08418

§ 371 (c)(1),
(2), (4) Date: Jul. 30, 2001

(87) PCT Pub. No.: WO01/41204

PCT Pub. Date: Jun. 7, 2001

(65) Prior Publication Data

US 2002/0160103 A1 Oct. 31, 2002

(30) Foreign Application Priority Data

Nov. 30, 1999 (JP) .......................................... 11-340220
Oct. 3, 2000 (JP) ..................................... 2000-303816

(51) Int. Cl.⁷ ............................................. H01L 21/44
(52) U.S. Cl. ....................... 438/679; 438/610; 148/220; 427/226; 427/250
(58) Field of Search ................................. 148/220, 518, 148/277, 283–287, 513; 427/189–192, 226–229, 250, 335, 384; 438/680, 795, 610, 679, 780

(56) References Cited

U.S. PATENT DOCUMENTS

| 5,966,580 A | * | 10/1999 | Watanabe et al. ............... 419/9 |
| 5,993,701 A | * | 11/1999 | Ando et al. .................. 252/582 |
| 6,358,611 B1 | * | 3/2002 | Nagasawa et al. .......... 428/403 |
| 6,517,642 B2 | * | 2/2003 | Horie et al. ................. 148/220 |

FOREIGN PATENT DOCUMENTS

| JP | 51-123582 A | 10/1976 |
| JP | 03-132035 A | 6/1991 |
| JP | 04-157727 A | 5/1992 |

* cited by examiner

Primary Examiner—Matthew Smith
Assistant Examiner—Calvin Lee
(74) Attorney, Agent, or Firm—Browdy and Neimark, P.L.L.C.

(57) ABSTRACT

The present invention relates to a method of and an apparatus for forming a thin metal film of copper, silver, or the like on a surface of a semiconductor or another substrate. A method of forming a thin metal film, comprises preparing a dispersed liquid having a metal-containing organic compound dispersed in a predetermined solvent, coating the dispersed liquid on a surface of a substrate and evaporating the solvent to form a coating layer, and applying an energy beam to the coating layer to decompose away an organic substance contained in the coating layer in an area irradiated with the energy beam and bond metal contained in the coating layer. According to the present invention, it is possible to form a thin metal film of good quality efficiently and stably. The thin metal film used as metal interconnects in highly integrated semiconductor circuits contributes to the progress of a process of fabricating semiconductor devices.

8 Claims, 9 Drawing Sheets

F I G. 12
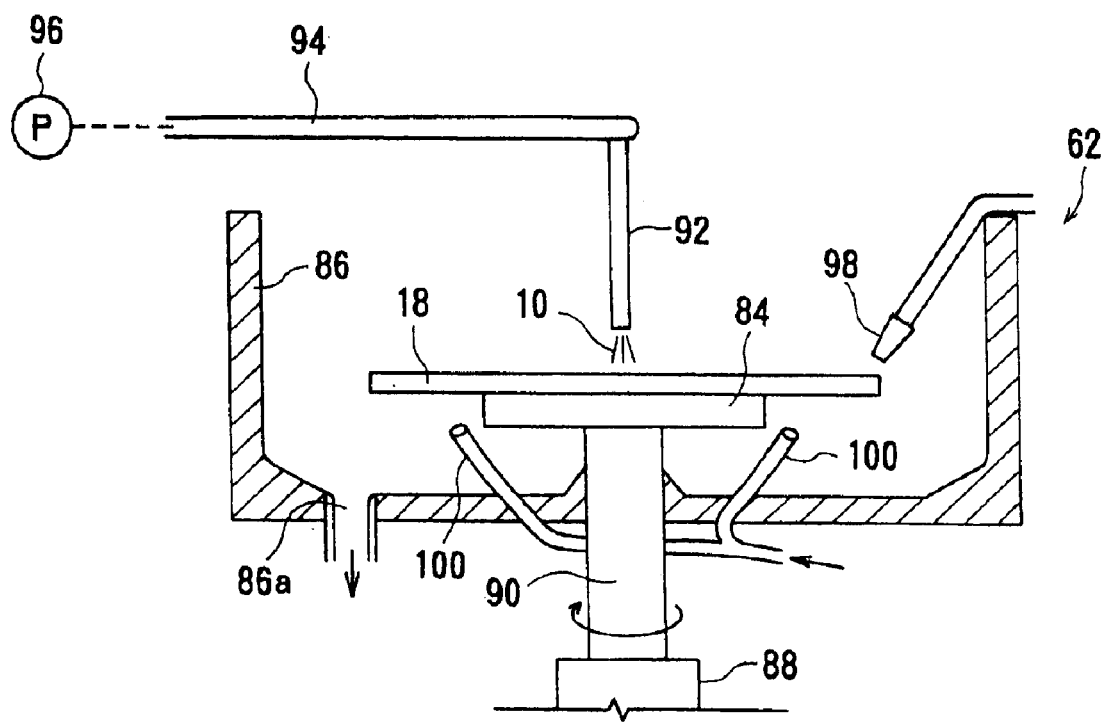
F I G. 13
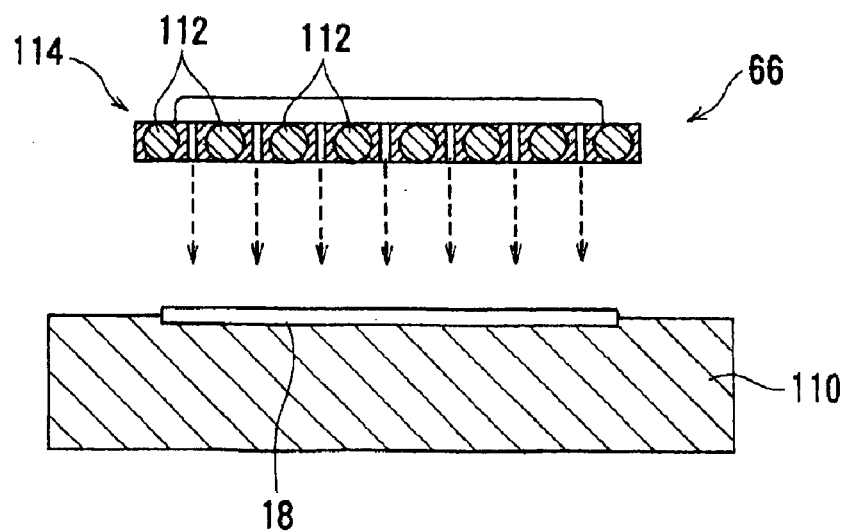

METHOD AND APPARATUS FOR FORMING THIN FILM OF METAL

REFERENCE TO RELATED APPLICATIONS

The present application is the national stage under 35 U.S.C. §371 of international application PCT/JP00/08418, filed Nov. 29, 2000 which designated the United States, and which application was not published in the English language.

TECHNICAL FIELD

The present invention relates to a method of and an apparatus for forming a thin metal film of copper, silver, or the like on a surface of a semiconductor or another substrate, and more particularly to a method of and an apparatus for forming a thin metal film to form a fine metal interconnect in a highly integrated circuit formed on a semiconductor substrate.

BACKGROUND ART

Aluminum or aluminum alloy has generally been used as a material for forming interconnect circuits on semiconductor substrates. It has been customary practiced to grow a film of the material according to a process such as sputtering, CVD, or the like and then form a pattern in the film according to etching or the like. As the integrated density increases in recent years, there is a demand for the usage of silver, copper or its alloy, which has a higher conductivity, as an interconnect material. Since it is difficult to perform dry etching on these materials, it has been proposed to immerse a substrate having preformed interconnect pattern trenches therein in a plating liquid and perform electrolytic or electroless plating on the substrate to fill the trenches with silver, copper or its alloy.

However, the process of forming a pattern according to etching, for example, needs an increased number of steps, and fails to actually form patterns on metals that are difficult to etch. While the plating processes are an inexpensive and highly technically accomplished technology, the electrolytic plating process is capable of growing a film only on an electrically conductive material, whereas the electroless plating process suffers a problem in that substances contained in the plating liquid affect the natural environment and the working environment. Accordingly, there has been a strong need for the development of a technology capable of forming metal interconnects without involving etching or plating.

DISCLOSURE OF INVENTION

The present invention has been made in view of the foregoing problems and demand. It is an object of the present invention to provide a method of and an apparatus for forming a thin metal film of good quality by efficiently and stably, rather than by growing a film according to the conventional plating processes.

According to an invention described in claim 1, there is provided a method of forming a thin metal film, comprising preparing a dispersed liquid having a metal-containing organic compound dispersed in a predetermined solvent, coating the dispersed liquid on a surface of a substrate and evaporating the solvent to form a coating layer, and applying an energy beam to the coating layer to decompose away an organic substance contained in the coating layer in an area irradiated with the energy beam and bond metal contained in the coating layer.

The metal component contained in the metal-containing organic compound is uniformly spread on the surface of the substrate, and the organic substance in the metal-containing organic compound is easily and efficiently removed by the application of the energy beam, thus forming a thin metal film of high quality composed of the metal component contained in the metal-containing organic compound on the surface of the substrate.

According to an invention described in claim 2, in the method of forming a thin metal film according to claim 1, a metal powder is dispersed in the dispersed liquid. With this arrangement, the thickness of the thin metal film can be increased by the metal powder.

According to an invention described in claim 3, there is provided a method of forming a thin metal film, comprising preparing a dispersed liquid having a metal-containing organic compound dispersed in a predetermined solvent, coating the dispersed liquid on a surface of a substrate and evaporating the solvent to form a coating layer, applying an energy beam to the coating layer to decompose away an organic substance contained in the coating layer in an area irradiated with the energy beam and bond metal contained in the coating layer to form a metal pattern, and dissolving away the metal-containing organic compound left on the surface of the substrate with a solvent.

With the above arrangement, it is possible to form, on the surface of the substrate, metal patterns composed of only a metal constituting at least a portion of the metal-containing organic compound positioned in an area irradiated with the energy beam, without performing an etching or plating process.

According to an invention described in claim 4, the method of forming a thin metal film according to claim 3, further comprises forming an insulating film on the surface of the substrate, and chemical mechanical polishing the surface of the insulating film. With this arrangement, metal patterns formed on the surface of the substrate can be separated from each other by the insulating film, exposing the surfaces of the metal patterns.

According to an invention described in claim 5, in the method of forming a thin metal film according to any one of claims 1 through 4, the metal-containing organic compound comprises ultrafine composite metal particles having a core made substantially of a metal component having an average diameter ranging from 1 to 100 nm and a covering layer of an organic substance chemically bonded to the core, and/or a metal complex.

For manufacturing ultrafine particles made at least partly of a metal, there has been proposed a process of evaporating the metal in a vacuum in the presence of a small amount of a gas to agglomerate ultrafine particles made of only the metal from the gas phase, producing ultrafine metal particles. Such a physical process, however, does not lend itself to mass production as the amount of generated ultrafine metal particles is small, and is costly because a device for generating an electron beam, a plasma, or a laser beam or a device for performing inductive heating is necessary to evaporate the metal. In addition, since the particle diameters range in a wide distribution, some of the metal particles remain unmelted when heated, failing to obtain a uniform metal film of low resistance.

When ultrafine particles made of only the metal is used, the ultrafine particles tend to agglomerate in a dispersed liquid, the ultrafine particle dispersed liquid is liable to provide an irregular covering layer. One solution would be to add a suitable surface active agent to the ultrafine particle dispersed liquid to turn them into a protective colloid. However, such a protective colloid fails to provide sufficient dispersion stability.

The bonded structure of ultrafine composite metal particles according to the present invention appears to be such that a core made of a metal component and an organic compound making up a covering layer share metal molecules, or an organic compound and a core form a complex-analogous structure by way of an ionic bond, though the details of the bonded structure are not clear. Since such ultrafine composite metal particles can be produced by a chemical process in a liquid phase, they can be mass-produced at a reduced cost in an ordinary atmospheric environment with a simple apparatus without the need for a large vacuum device. Since the ultrafine composite metal particles have a uniform diameter, all the ultrafine composite metal particles are melted and bonded together at a constant temperature. Inasmuch as the ultrafine composite metal particles are covered with an organic metal compound therearound, their ability to agglomerate in a solvent is small, and hence they can easily be scattered uniformly over the surface of the substrate. The ultrafine composite metal particles are stable and hence can easily be handled. Even after the solvent is evaporated, the ultrafine composite metal particles remain chemically stable until they are decomposed with heat. Therefore, the ultrafine composite metal particles can be handled for easy process management.

According to an invention described in claim 6, in the method of forming a thin metal film according to claim 5, the core made substantially of a metal component has an average diameter ranging from 1 to 20 nm. It is known that the melting point of an ultrafine metal particle for use in the metal-containing organic compound is lowered as the diameter thereof is reduced. This effect starts to manifest itself when the diameter of the metal particle is 20 nm or less, and becomes distinctive when the diameter of the metal particle is 10 nm or less. Therefore, the average diameter of the ultrafine particles are in the range from 1 to 20 nm, and preferably in the range from 1 to 10 nm.

According to an invention described in claim 7, in the method of forming a thin metal film according to claim 1, the energy beam comprises an electron beam, and is applied in air, an inactive gas, or a vacuum. The energy beam may comprise any of various energy beams, but an electron beam is particularly effective as the energy beam. An accelerating voltage of the electron beam should preferably be 150 kV or lower. Certain patterns may be formed by scanning the substrate with the electron beam directly or through a mask.

According to an invention described in claim 8, there is provided a semiconductor device having interconnects formed by a method of forming a thin metal film according to claim 1.

There is provided an apparatus for forming a thin metal film, comprising a dispersed liquid supply device for coating a surface of a substrate with a dispersed liquid having a metal-containing organic compound dispersed in a predetermined solvent, and an energy beam applying device for applying an energy beam to a coating layer formed by evaporating the solvent in the dispersed liquid coated on the surface of the substrate so as to decompose away an organic substance contained in the coating layer in an area irradiated with the energy beam and bond metal contained in the coating layer.

The apparatus for forming a thin metal film further comprises an insulating film forming device for forming an insulating film on the surface of the substrate, and a polishing device for chemical mechanical polishing the surface of the substrate to remove an excessive insulating film therefrom.

The dispersed liquid supply device evaporates the solvent in the metal-containing organic compound coated on the surface of the substrate.

Further, the invention comprises a supplementary drying device for supplementarily drying the solvent in the metal-containing organic compound coated on the surface of the substrate. With this arrangement, it is possible to completely dry up an organic solvent which cannot be fully dried up by a spin drying process (air drying process) using a spin coater or the like, thus preventing voids from being produced in a heating process.

The devices are sequentially arranged in an indoor facility along a direction in which the substrate moves. With this arrangement, corresponding steps can successively be performed by the devices in the sequence.

The devices are accommodated individually in respective chambers disposed radially around a central transfer chamber with a transfer robot disposed therein. With this arrangement, corresponding steps can be individually performed and can be combined with each other.

Further, the invention comprises a computer for controlling the devices according to feedback management. With this arrangement, the processed status in a subsequent step can be reflected in a earlier step, and the steps can be optimized together for thereby increasing the product quality for an increased yield.

BRIEF DESCRIPTION OF DRAWINGS

FIG. 12 is a vertical cross-sectional view of the dispersed liquid supply device of the apparatus for forming a film according to the present invention;

FIG. 13 is a cross-sectional view of a supplementary drying device of the apparatus for forming a film according to the present invention;

BEST MODE FOR CARRYING OUT THE INVENTION

An embodiment according to the present invention will be described below with reference to the drawings.

FIGS. 1A through 1D show steps of a method of forming a thin metal film on an entire surface of a substrate according to a first embodiment of the present invention.

Figure 1A:
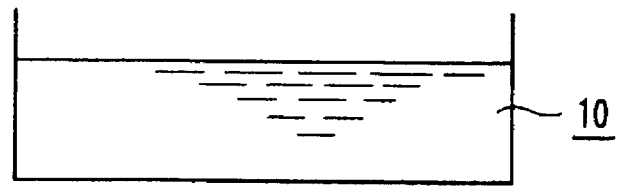
FIG. 1 is a view showing steps of a method of forming a thin metal film according to a first embodiment of the present invention.

As shown in FIG. 1A, a dispersed liquid 10 is prepared which dispersed a metal-containing organic compound made of ultrafine metal particles and/or a metal complex in a given solvent. In this example, a metal powder having a particle diameter ranging from 1 to 10 $\mu$m, preferably about 8 $\mu$m, may be dispersed in the dispersed liquid 10. The dispersion of the metal powder is effective to increase the thickness of a thin metal film.

The dispersed liquid of ultrafine metal particles may be an ultrafine particle dispersed liquid obtained by:

(1) a method of manufacturing a metal paste by evaporating a metal in an atmosphere in a vacuum chamber of an inactive gas under the pressure of 10 Torr or less, and simultaneously introducing a vapor of an organic solvent containing one or more alcohols having a carbon number of 5 or more or an organic solvent containing one or more organic esters to cover the surfaces of refined ultrafine metal particles with the organic solvent;

(2) a method of manufacturing ultrafine metal particles with organic molecular chains bonded to the metal surface in a micelle formed by a surface active agent, by mixing multiple twin particles generated on the surface of an alkali halide or the like by vacuum evaporation with an organic solution having an absorbed group to a metal surface such as alkane thiol;

(3) ultrafine particles mainly composed of an organic metal compound and a metal component derived from the organic metal compound, having a central region made essentially of the metal component and surrounded by the organic metal compound, and having an average particle diameter ranging from 1 to 100 nm;

(4) a method of manufacturing ultrafine particles by heating an organic metal compound in an inactive gas atmosphere isolated from air at a temperature equal to or higher than the temperature to start decomposing the organic metal compound and lower than the temperature to fully decompose the organic metal compound; or (5) ultrafine metal particles and a method of manufacturing the same whose surfaces are protected by thiol, obtained by adding thiol or a thiol solution to a solution which is produced by reducing a solution dissolved a metal salt and amine in a solvent;

or an ultrafine particle dispersed liquid in which ultrafine particles produced by any of the above methods are dispersed.

Figure 2A:
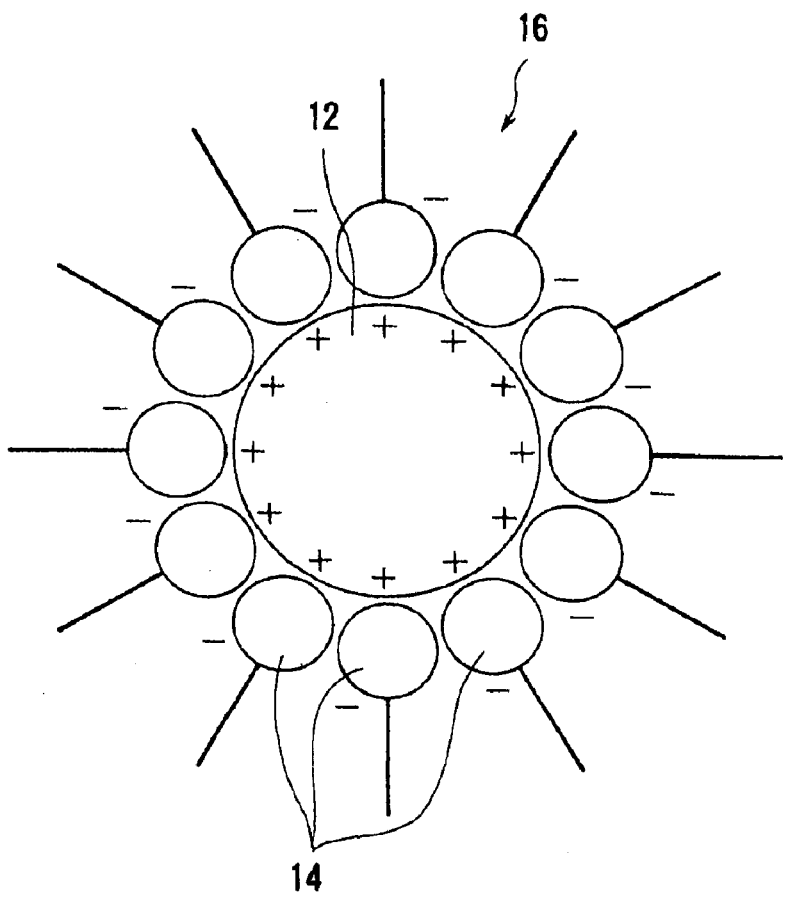
FIG. 2 is a view schematically showing the structure of an ultrafine particle as a material.
Figure 2B:
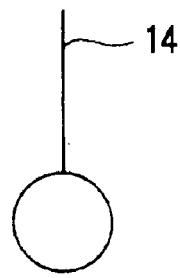

As shown in FIGS. 2A and 2B, each of the ultrafine metal particles contained in the dispersed liquid 10 preferably be an ultrafine composite metal particle 16 comprising a core 12 made substantially of a metal component and covering layers 14 made of an organic compound. The ultrafine composite metal particles 16 are stable because their cores 12 are covered with the covering layers 14 of an organic compound, and have a small tendency to agglomerate in the solvent.

The ratio of the metal component in the ultrafine composite metal particles 16 usually ranges from 50 to 90 weight %. For use as interconnects, the ratio of the metal component in the ultrafine composite metal particles 16 is preferably in the range from 60 to 90 weight %, and more preferably in the range from 70 to 90 weight %.

Each of the ultrafine composite metal particles 16 is composed of an organic compound and a metal component derived from a metal salt as a starting material, e.g., carbonate, formate, or acetate. Each of the ultrafine composite metal particles 16 has its central region made of the metal component and surrounded by the ionic organic compound. At this time, the organic compound and the metal component are chemically bonded partly or wholly to each other, and exist in integral unity. The ultrafine composite metal particles 16 have high stability and are stable at a higher metal concentration unlike conventional ultrafine particles which are stabilized by being coated with a surface active agent.

The cores 12 of the ultrafine composite metal particles 16 have an average diameter which usually ranges from 1 to 20 nm and preferably from 1 to 10 nm. The ultrafine composite metal particles 16 can be manufactured, for example, by heating a metal salt, e.g., carbonate, formate, or acetate, in a nonaqueous solvent in the presence of an ionic organic substance at a temperature that is equal to or higher than the decomposition reducing temperature of the metal salt and also is equal to or lower than the decomposition temperature of the ionic organic substance.

The metal component comprises at least one of Cu, Ag, Au, Zn, In, Si, Sn, Pd, Fe, Co, Ni, Ru, Rh, Os, Ir, Pt, Cr, Mo, Ba, Bi, Al, W, Ta, Ti, and Pb. The ionic organic substance comprises a fatty acid having a carbon number of 5 or more, an alkylbenzene sulfonic acid, or an alkyl sulfonic acid.

The heating temperature is equal to or higher than the decomposition reducing temperature of the metal salt, e.g., carbonate, formate, or acetate, and also is equal to or lower than the decomposition temperature of the ionic organic substance. For example, if silver acetate is used as the metal salt, then since its decomposition reducing temperature is 200° C., the metal salt may be kept at a temperature that is equal to or higher than 200° C. and low enough to keep the ionic organic substance from being decomposed. To prevent the ionic organic substance from being decomposed, the heating atmosphere should preferably be an inactive gas atmosphere. However, the metal salt may be heated in the atmosphere by selecting a nonaqueous solvent for dispersing the ultrafine composite metal particles 16 therein.

For heating the metal salt, various alcohols may be added for accelerating the reaction. Such alcohols are not limited to any particular alcohols, but may be lauryl alcohol, glycerin, ethylene alcohol, or the like, for example, insofar as they can accelerate the reaction. The amount of the added alcohol may be determined depending on the type of the added alcohol. Usually, the alcohol is added in 5 through 20 parts by weight, preferably 5 through 10 parts by weight, with respect to 100 parts by weight of the metal salt.

After the heating, the ultrafine composite metal particles 16 are refined according to a known refining process such as a centrifugal separation process, a film refining process, a solvent extracting process, or the like, for example.

The ultrafine composite metal particles 16 thus produced are dispersed in a suitable solvent, producing the dispersed liquid 10. Since the ultrafine composite metal particles 16 as dispersed particles are very small, the dispersed liquid 10 is substantially transparent when the ultrafine composite metal particles 16 are mixed and stirred. Properties of the dispersed liquid 10 such as surface tension, viscosity, etc. may be adjusted by appropriately selecting the type of the solvent, the concentration of the ultrafine composite metal particles in the solvent, and temperature, etc.

Figure 1B:
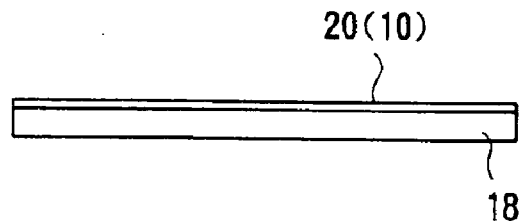

Then, as shown in FIG. 1B, the surface of a substrate 18 is coated with the dispersed liquid 10, thus forming a dispersed liquid film 20 made of the dispersed liquid 10. The substrate 18 may be made of a semiconductor such as Si, Ga, As, or InP, or sapphire, magnesia, quartz, a ferrodielectric material, metal, glass, or the like, and is not limited to any particular materials. For use with semiconductor interconnects, in particular, the substrate 18 may comprise a substrate having a barrier metal layer for preventing metal from being diffused into the substrate or a substrate having a seed layer on such a barrier metal layer. The dispersed liquid 10 may be coated by a process of coating a liquid, such as a spraying process, a spinning process, or the like, or a process of coating a paste such as a screen printing process or the like. Any of these processes may be selected depending on the application of the thin metal film.

Figure 1C:
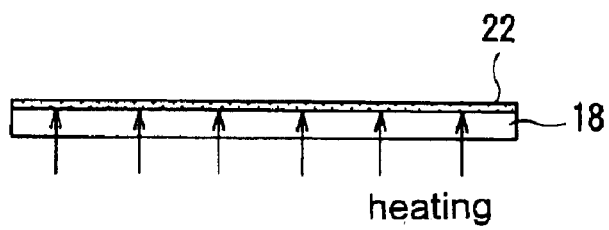

Then, as shown in FIG. 1C, the solvent of the dispersed liquid film 20 coated on the surface of the substrate 18 is evaporated to form a coating layer 22. The dispersed liquid film 20 may be dried in air if an organic solvent having a low boiling point is used, or may be dried by the combination of heating and vacuum drying, etc. if an organic solvent having a high boiling point is used.

Figure 1D:
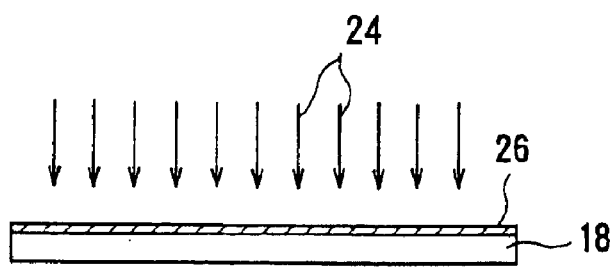

Then, as shown in FIG. 1D, an energy beam 24 such as an electron beam, for example, is applied to the coating layer 22 on the surface of the substrate 18 in an inactive gas atmosphere or a vacuum. By being irradiated with the energy beam 24, the organic substance contained in the coating layer 22 is decomposed away and metal particles contained in the coating layer 22 are bonded to produce a thin metal film 26, which is made of only the metal component contained in the metal-containing organic compound, on the surface of the substrate 18.

The accelerating voltage applied to the energy beam (electron beam) 24 is not limited to any level, but may be of such a level as to cause the energy beam 24 to reach the coating layer 22. Preferably, the accelerating voltage should be 150 kV or less. Under the above accelerating voltage, the energy beam 24 can also be extracted into air or an atmosphere other than vacuum, such as an inactive gas. Since the absorption efficiency is higher as the accelerating voltage is lower, the energy beam 24 may be absorbed efficiently by only the coating layer 22 by adjusting the accelerating voltage. In this manner, the organic substance can be removed without heating the substrate 18.

In order to apply the energy beam 24 to the coating layer 22 under the accelerating voltage in the above range to achieve the above advantageous effect, it is necessary for an energy beam applying device to have a window made of a material that is thin and less capable of absorbing the energy beam. This is because it is known in the art that if the amount of the energy beam absorbed by the window material were large, the energy beam would not reach the coating layer 22 as a target to be treated or the window material would be heated beyond an air-cooling capability under the above accelerating voltage. The window is preferably made of Si, Ti, or the like.

FIGS. 3A through 7B show steps of a method of forming a thin metal film according to a second embodiment of the present invention, which is suitable for forming fine interconnects in a highly integrated circuit formed on a semiconductor substrate.

Figure 3A:
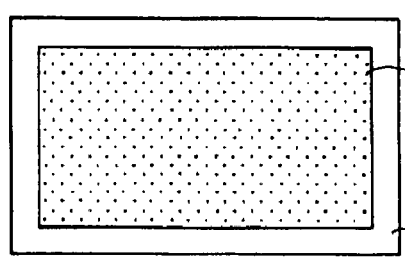
FIG. 3 is a view showing a state when a coating layer is formed by a method of forming a thin metal film according to a second embodiment of the present invention.
Figure 3B:
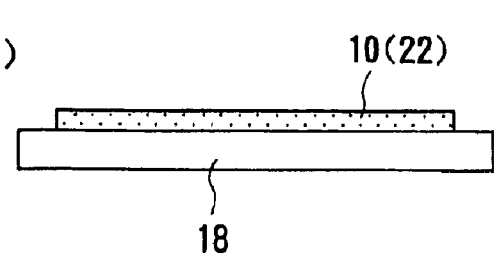

As shown in FIGS. 3A and 3B, a process of holding a dispersed liquid 10 in contact with the surface of a substrate 18 and evaporating the solvent of the dispersed liquid 10 attached to the surface of the substrate 18 is repeated a plurality of times, as necessary, to form a coating layer 22 having a predetermined thickness.

The dispersed liquid 10 may be held in contact with the surface of the substrate 18 by any of various processes. These processes include an immersion process in which the dispersed liquid is held in a container to form a liquid reservoir and the substrate is immersed in the liquid reservoir, a spraying process in which the dispersed liquid is sprayed toward the substrate, and a spin coating process in which the dispersed liquid is dropped onto the substrate and then the substrate is rotated. In these processes, unwanted areas of the substrate surface may be masked. The solvent may be dried at normal temperature or by being heated.

Figure 4A:
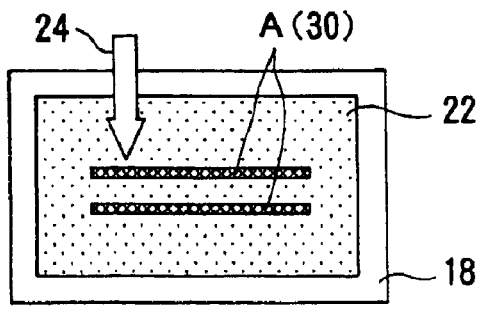
FIG. 4 is a view illustrative of the application of an energy beam in the method according to the second embodiment.
Figure 4B:
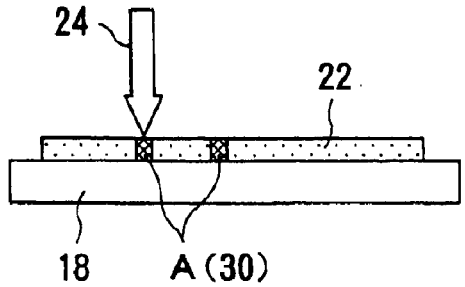

Then, as shown in FIGS. 4A and 4B, an energy beam 24 such as a light-beam or an electron beam is applied to the coating layer 22 along interconnect patterns thereon to decompose away an organic substance contained in the coating layer 22 positioned in areas A irradiated with the energy beam 24 and bond metal particles contained in the coating layer 22, thus forming metal patterns 30. If the dispersed liquid 10 comprises a liquid with ultrafine metal particles in the form of ultrafine composite metal particles 16 dispersed therein each comprising a core 12 made substantially of a metal component and covering layers 14 of an organic compound, as shown in FIGS. 2A and 2B, then ultrafine composite metal particles 16 in the area A are heated by the energy beam 24 to a temperature higher than a temperature at which the covering layers (organic compound) 14 are released from the core 12, or a temperature higher than a temperature at which the covering layers 14 are decomposed. The covering layers 14 are released from the core 12 or the covering layers 14 are decomposed away, and the cores 12 are simultaneously bonded together.

In this example, given positions on the coating layer 22 are scanned by the energy beam 24. However, the energy beam may be applied to the entire surface of the substrate with unwanted areas thereof being masked, as described below.

Figure 5A:
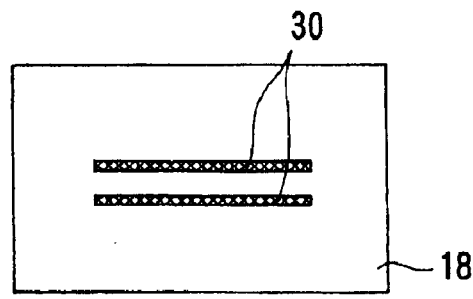
FIG. 5 is a view illustrative of a state after the removal of ultrafine particles left on the surface of a substrate in the method according to the second embodiment.
Figure 5B:
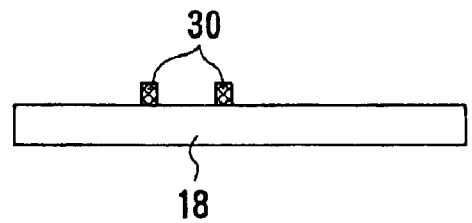

Then, as shown in FIGS. 5A and 5B, the metal-containing organic compound left on the surface of the substrate 18, i.e., the metal-containing organic compound positioned in areas of the coating layer 22 other than the areas A irradiated with the energy beam 24, is re-dissolved in a suitable solvent and removed, exposing metal patterns 30 along the interconnect patterns. At this time, the ultrafine composite metal particles 16, shown in FIGS. 2A and 2B, for example, left on the substrate 18 are easily dissolved in the solvent because the covering layers 14 have not been eliminated.

Figure 6A:
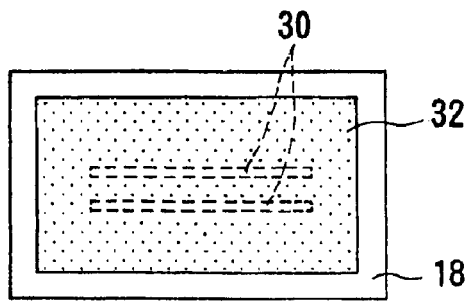
FIG. 6 is a view illustrative of a state after an insulating film is deposited in the method according to the second embodiment.
Figure 6B:
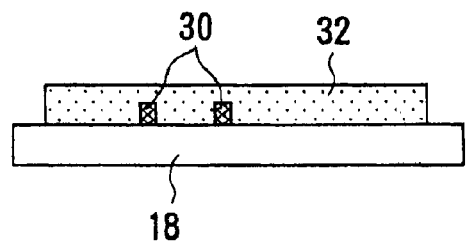

Then, as shown in FIGS. 6A and 6B, an insulating film 32 is deposited on the surface of the substrate 18 and baked. The insulating film 32 serves to separate the metal patterns 30, and is deposited to a height larger than the thickness of the metal patterns 30.

Figure 7A:
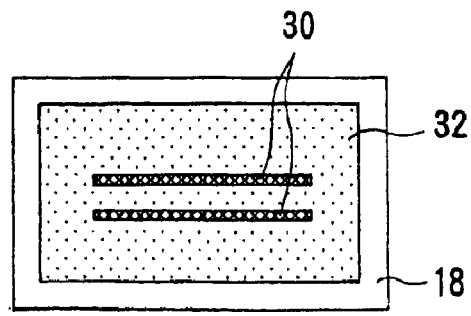
FIG. 7 is a view illustrative of a state after the assembly is polished by a CMP process.
Figure 7B:
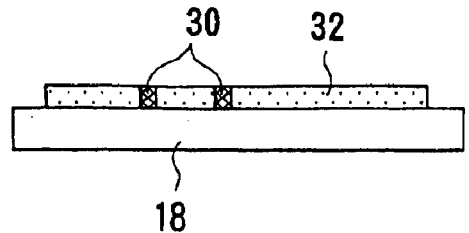

Then, as shown in FIGS. 7A and 7B, the surface of the insulating film 32 is polished by a CMP (Chemical Mechanical Polishing) process to make the surface of the insulating film 32 lie flush with the surfaces of the metal patterns 30, thus exposing the surfaces of the metal patterns 30. The metal patterns 30 now form metal interconnects embedded in the insulating film 32.

In the above embodiment, the ultrafine composite metal particles are used as the ultrafine particles, and dispersed in the solvent, producing the ultrafine particle dispersed liquid. However, ultrafine particles made of a generally known metal only may be used instead of the ultrafine composite metal particles and dispersed in a solvent, producing an ultrafine particle dispersed liquid. Alternatively, a metal complex may also be used.

An apparatus for forming a thin metal film, which is used to carry out the above method of forming a thin metal film, will be described below with reference to FIGS. 8 through 18.

Figure 8:
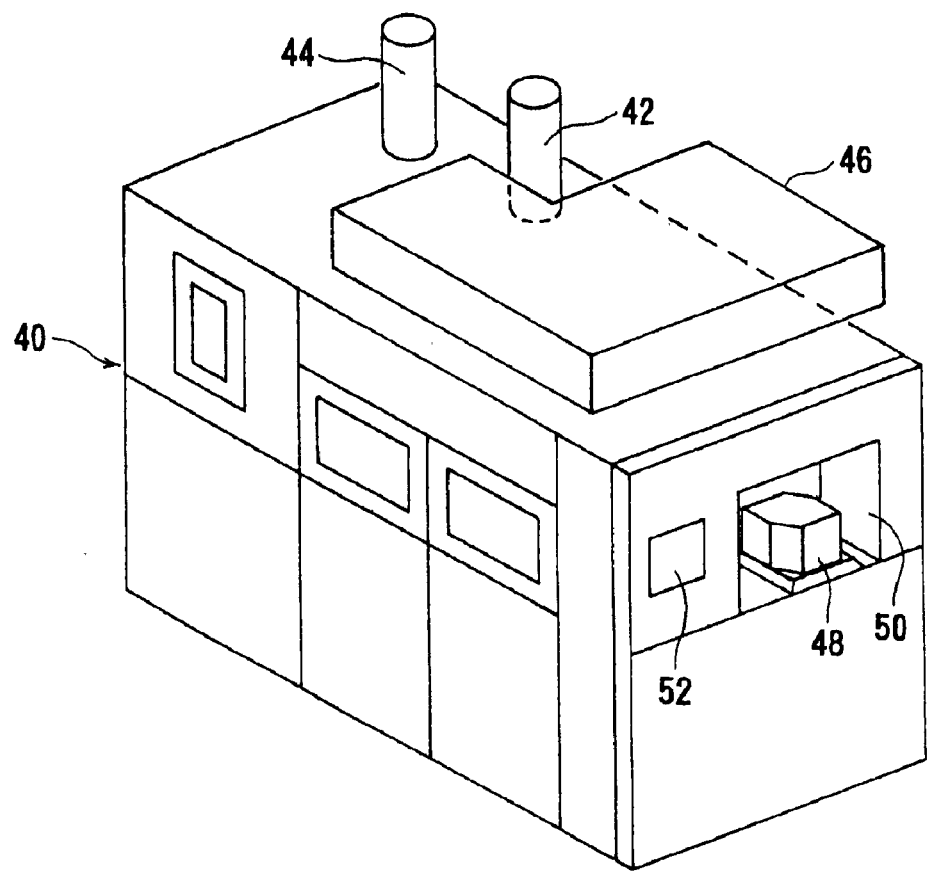
FIG. 8 is a view showing an appearance of an apparatus for forming a film according to the present invention.

FIG. 8 shows a rectangular indoor facility 40 which incorporates an apparatus for forming a thin metal film. The indoor facility 40 has on its ceiling a discharge duct 42 for discharging exhaust gases in a dispersed liquid supply section 64 and a heat-treating section 68, described below, a discharge duct 44 for discharging exhaust gases in an energy beam applying section 72 and an insulating film forming section 75, and an air-conditioning section 46 for air-conditioning a polishing (CMP) section 78, etc. The indoor facility 40 also has an inlet/outlet port 50 defined in a side wall thereof for introducing and removing a cassette 48 with substrates 18 housed therein and a control panel 52 mounted on the side wall.

Figure 9:
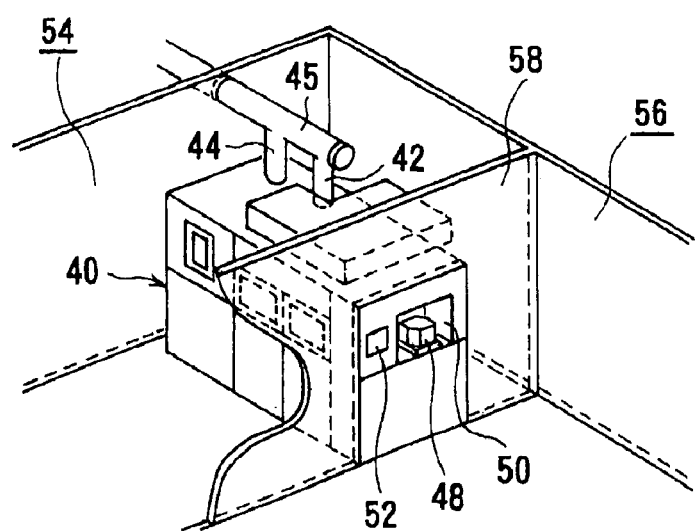
FIG. 9 is a view showing, by way of example, the apparatus for forming a film according to the present invention which is disposed in a clean room.

As shown in FIG. 9, for example, the indoor facility 40 is disposed in a utility zone 54 of a clean room. The indoor facility 40 has an end portion located in an opening defined in a partition wall 58 which divides the utility zone 54 and a clean zone 56 from each other, with the inlet/outlet port 50 and the control panel 52 being exposed in the clean zone 56. The discharge ducts 42, 44 are communicated with a common discharge duct 45 that extends out of the utility zone 54.

Figure 10:
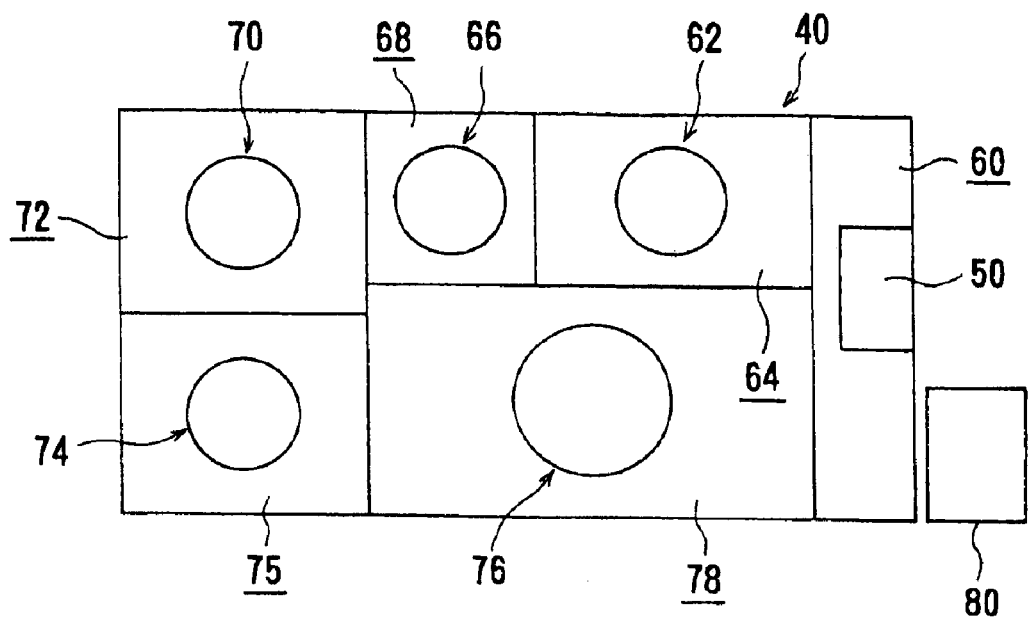
FIG. 10 is a plan view of the apparatus for forming a film according to the present invention.

As shown in FIG. 10, the indoor facility 40 has its interior divided into a loading/unloading section 60 having the inlet/outlet port 50, a dispersed liquid supply section 64 housing a dispersed liquid supply device 62 therein, a supplementary drying section 68 housing a supplementary drying device 66 therein, an energy beam applying section 72 housing an energy beam applying device 70 therein, an insulating film forming section 75 housing an insulating film forming device 74 therein, and a polishing section 78 housing a polishing device 76 therein. These devices 62, 66, 70, 74, 76 are arranged in a sequence along the direction in which the substrate flows, so that a series of film forming steps can successively be performed on the substrate. The dispersed liquid supply section 64 and the heat-treating section 68 are of an explosion-proof structure in view of the explosiveness of an organic solvent.

The devices 62, 66, 70, 74, 76 are operated and managed by respective independent control computers. Operating and managing information of these devices is exchanged between these computers by a process management computer 80, which performs a process feedback management process thereby to optimize the process as a whole.

The operating and managing information includes quality managing information produced by an analyzing device in si-tu. For example, if the thickness of a coating layer formed in a coating layer forming step tends to become insufficient, then the thickness insufficiency is predicted and the processing time of the coating layer forming step is extended. Information of the extended processing time is fed back to the energy beam applying step to hold a workpiece in a primary storage location, and the processing of a next workpiece is extended without operator's instruction for thereby increasing the product quality for an increased yield.

In the present embodiment, the indoor facility 40 has a single inlet/outlet port for storing one cassette therein. However, the indoor facility may have two inlet/outlet ports for storing respective cassettes therein.

Figure 11:
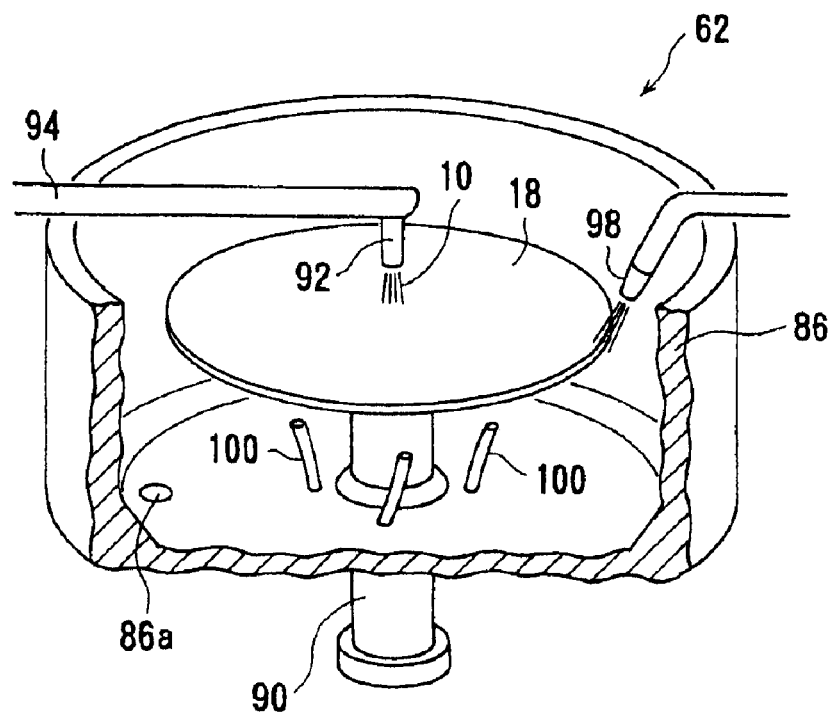
FIG. 11 is a perspective view, partly broken away, of a dispersed liquid supply device of the apparatus for forming a film according to the present invention.

FIGS. 11 and 12 show the dispersed liquid supply device 62. The dispersed liquid supply device 62, which supplies the dispersed liquid 10 to the surface of the substrate 18, comprises a substrate holder 84 for holding and rotating the substrate 18 with its interconnect forming surface (face side) oriented upwardly, and a bottomed cup-shaped scattering prevention cup 86 surrounding the substrate 18 held by the substrate holder 84. The substrate holder 84 has a vacuum chuck on its upper surface for attracting and holding the substrate 18, and is connected to the upper end of a rotatable shaft 90 that extends from a servomotor 88 for rotation upon energization of the servomotor 88. The scattering prevention cup 86 is made of a material resistant to organic solvents, e.g., stainless steel.

A downwardly directed dispersed liquid supply nozzle 92 for dropping the dispersed liquid 10 is positioned upwardly of either the center of the surface of the substrate 18 held by the substrate holder 84 or a spot slightly off the center of the surface of the substrate 18. The dispersed liquid supply nozzle 92 is connected to the free end of an arm 94. The arm 94 accommodates therein a pipe for supplying a metered amount of dispersed liquid 10. The pipe extends from a metered amount supply device 96 such as a syringe pump or the like and is communicated with the dispersed liquid supply nozzle 92.

A bevel washing nozzle 98 which is inclined downwardly inwardly is positioned above the circumferential area of the substrate 18 held by the substrate holder 84, for supplying a washing liquid to the bevel of the substrate 18. A plurality of reverse side washing nozzles 100 which are inclined upwardly outwardly are positioned below the substrate 18 held by the substrate holder 84, for supplying a gas or washing liquid to the reverse side of the substrate 18. The scattering prevention cup 86 has a drain hole 86a defined in its bottom.

In operation, the substrate 18 is held by the substrate holder 84, and the servomotor 88 is energized to rotate the substrate 18 at a speed ranging from 300 to 500 rpm, for example, more preferably from 400 to 500 rpm. While the substrate 18 is being thus rotated, the dispersed liquid supply nozzle 92 drops a metered amount of dispersed liquid 10 onto the central area of the surface of the substrate 18. When the surface of the substrate 18 is covered with the dispersed liquid 10, the dropping of the dispersed liquid 10 is stopped, thus uniformly coating the surface of the substrate 18 with the dispersed liquid 10. At the same time, the bevel washing nozzle 98 supplies a hydrophilic organic solvent such as methanol, acetone, or the like, or a washing liquid such as ethanol, isopropyl alcohol, or the like, to the bevel of the substrate 18 to prevent the dispersed liquid 10 from dropping from the edge of the substrate 18 or flowing across the edge of the substrate 18 to the reverse side of the substrate 18. The reverse side washing nozzles 100 also supplies a gas such as an $N_2$ gas, air, or the like, or a washing liquid which is the same as the washing liquid supplied to the bevel of the substrate 18, to the reverse side of the substrate 18 to prevent the contamination of the reverse side of the substrate 18 by using the gas flow or the washing liquid.

With the dropping of the dispersed liquid 10 being stopped, the servomotor 88 rotates the substrate 18 to dry the substrate 18 in a spin drying process (air drying process) to evaporate the solvent in the dispersed liquid 10 coated on the substrate 18.

The process of applying the dispersed liquid 10 to the interconnect forming surface of the substrate 18 and spin-drying the substrate 18 is repeated a plurality of times as required. This process is put to an end when the coating layer 22 (see FIGS. 1C and 4) deposited on the substrate 18 reaches a certain thickness.

Finally, the substrate may be rotated at a higher speed to quicken the drying of the solvent. An excessive amount of dispersed liquid 10 and the washing liquid that has been used to wash the bevel and reverse side of the substrate are discharged out of the drain hole 86a.

As shown in FIG. 13, the supplementary drying device 66 has a substrate holding base 110 for holding the substrate 18 with its face side oriented upwardly and a heating device 114 disposed above the substrate holding base 110, the heating device 114 comprising lamp heaters 112, for example.

The supplementary drying device 66 serves to dry up the solvent that has not been evaporated by the spin drying process carried out by the dispersed liquid supply device 62. The supplementary drying device 66 may not necessarily be required if the solvent is sufficiently dried up by the spin-drying process carried out by the dispersed liquid supply device 62 such as when the coating layer 22 is coated as a very thin film.

Specifically, if an energy beam is applied to the surface of the coating layer 22 (see FIGS. 1C and 4) deposited on the surface of the substrate 18 to form a thin metal film while the organic solvent remains in the coating layer 22, then voids may possibly be formed in the thin metal film. Such voids are prevented from occurring by completely drying up the solvent with the supplementary drying device 66. The temperature to be achieved by the supplementary drying device 66 is preferably a temperature at which the ultrafine particles are not decomposed, e.g., about 100° C., for thereby preventing a contamination of the supplementary drying device 66 which would otherwise be caused by the decomposition of the ultrafine particles.

Figure 14:
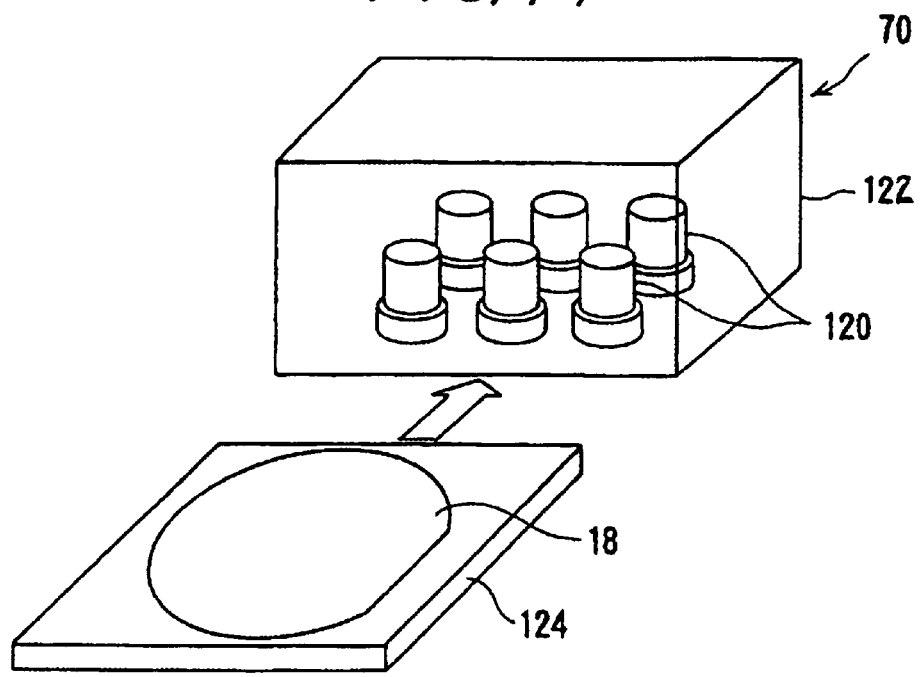
FIG. 14 is a view showing an energy beam applying device according to the present invention.
Figure 15:
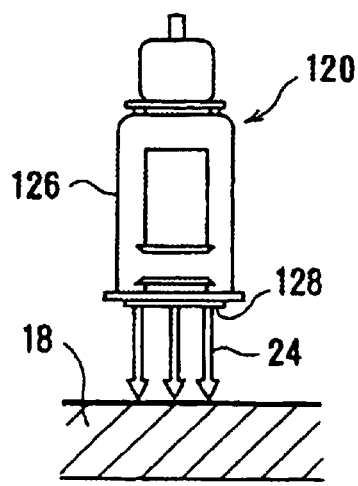
FIG. 15 is a front elevational view of an energy beam generator according to the present invention.

FIGS. 14 and 15 show the energy beam applying device 70. The energy beam applying device 70 comprises a lamp house 122 housing a plurality of energy beam generators 120 arranged over a surface, and a feed table 124 movable into and out of the bottom of the lamp house 122. Each of the energy beam generators 120 has a scanning tube 126 having a beam exit port 128 which is directed downwardly. The substrate 18 is placed on the upper surface of the feed table 124 with the coating layer oriented upwardly, and the feed table 124 is loaded into the bottom of the lamp house 122. Thereafter, the energy beam generator 120 is energized to apply an energy beam (electron beam) 24 (see FIGS. 1D and 4) toward the substrate 18. When irradiated with the energy beam 24, the organic substance contained in the coating layer 22 is decomposed away and the metal particles contained in the coating layer 22 are bonded to form a thin metal film (see FIG. 1D) or metal patterns 30 (see FIG. 4) composed of only the metal component contained in the metal-containing organic compound on the surface of the substrate 18.

Figure 16A:
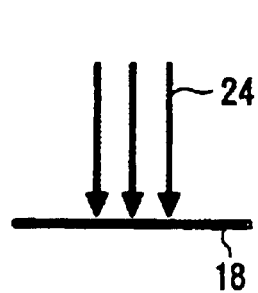
FIG. 16 is a view illustrative of the application of an energy beam to a substrate.
Figure 16B:
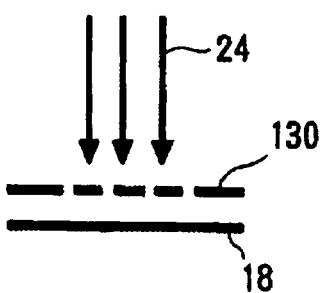

In this example, each of the energy beam generators 120 comprises an electron beam generator for applying an electron beam under a low accelerating voltage ranging from 30 to 70 kV, for example, and the electron beam is applied to the entire surface of the substrate 18 in a lump. For forming the thin metal film 26 shown in FIG. 1D, for example, the energy beam (electron beam) 24 is directly applied to the substrate 18, as shown in FIG. 16A. For forming the metal patterns 30 shown in FIG. 4, a mask 130 having a predetermined pattern is positioned below the beam exit port 128, and the energy beam (electron beam) 24 is applied through the mask 130 to the substrate 18, as shown in FIG. 16B. As described above, given positions on the coating layer 22 may be scanned by the energy beam 24.

Figure 17:
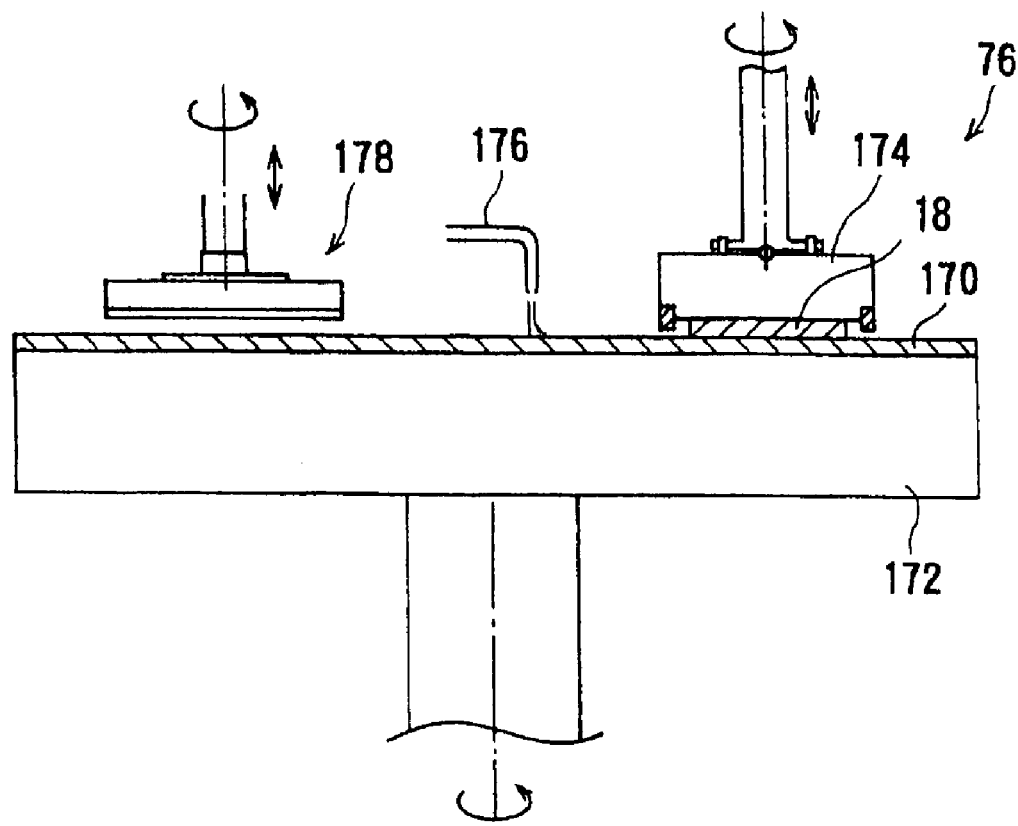
FIG. 17 is a schematic view of a polishing device according to the present invention.

FIG. 17 shows the polishing device 76 which performs chemical mechanical polishing (CMP) process onto the surface of the substrate 18 to remove an excessive insulated film therefrom. The polishing device 76 comprises a polishing table 172 with a polishing cloth (polishing pad) 170 applied to its upper surface to provide a polishing surface, and a top ring 174 for holding the substrate 18 with its surface to be polished being directed toward the polishing table 172. The polishing table 172 and the top ring 174 are rotated about their respective own axes. While the polishing cloth 170 is being supplied with an abrasive liquid from an abrasive liquid nozzle 176 disposed above the polishing table 172, the top ring 174 presses the substrate 18 under a constant pressure against the polishing cloth 170 on the polishing table 172, thereby polishing the surface of the substrate 18. The abrasive liquid supplied from the abrasive liquid nozzle 176 comprises, for example, an alkaline solution containing a suspended abrasive grain which comprises fine particles of silica or the like. Therefore, the substrate 18 is polished to a flat and mirror finish by a chemical and mechanical polishing process based on a combination of a chemical polishing action of the alkali and a mechanical polishing action of the abrasive grain.

When the polishing device 76 continuously performs the polishing process, the polishing power of the polishing surface of the polishing cloth 170 is lowered. To recover the polishing power, a dresser 178 is provided. The polishing cloth 170 is dressed by the dresser 178 as when the substrate 18 is replaced with another substrate to be polished. In the dressing process, a dressing surface (dressing member) of the dresser 178 is pressed against the polishing cloth 170 on the polishing table 172, and the dresser 178 and the polishing table 172 are rotated about their respective own axes to remove the abrasive liquid and the abatement attached to the polishing surface, and also to planarize and dress the polishing surface for thereby regenerating the polishing surface.

The apparatus for forming a thin metal film, thus constructed, operates as follows: The cassette 48 with substrates W housed therein is placed in the inlet/outlet port 50, and one substrate 18 is taken out of the cassette 48 and transferred to the dispersed liquid supply device 62 of the dispersed liquid supply section 64. In the dispersed liquid supply device 62, the surface of the substrate 18 is supplied with the dispersed liquid 10 and then spin-dried, and this process is repeated a plurality of times as required to form the coating layer 22 (see FIGS. 1 and 4). When the coating layer 22 reaches a predetermined thickness, the substrate 18 is delivered to the supplementary drying device 66, if necessary. In the supplementary drying device 66, the solvent in the coating layer 22 is evaporated.

Then, the substrate 18 with the coating layer 22 formed thereon is transferred to the energy beam applying device 70 of the energy beam applying section 72. The feed table 124 with the substrate 18 placed thereon is loaded into the bottom of the lamp house 122, and the energy beams (electron beams) 24 (see FIGS. 1D and 4) are applied from the energy beam generators 120 to the substrate 18, thus forming a thin metal film 26 (see FIG. 1D) or metal patterns 30 (see FIG. 4) composed of only the metal component contained in the metal-containing organic compound on the surface of the substrate 18.

Then, the metal-containing organic compound that remains on the surface of the substrate 18 is re-dissolved in a suitable solvent and removed, exposing the metal patterns 30 (see FIG. 5) along the interconnect patterns. Thereafter, the substrate 18 is transferred to the insulating film forming device 74 of the insulating film forming section 75, where an insulating film 32 is deposited on the surface of the substrate 18 and baked (see FIG. 6).

The substrate 18 with the insulating film formed thereon is transferred to the polishing device 76 of the polishing section 78. The polishing device 76 chemically and mechanically polishes the surface of the substrate 18 to remove an excessive insulated film therefrom (see FIG. 7). Thereafter, the substrate W is then returned to the cassette 48. The apparatus for forming a thin metal film is capable of successively performing the above steps in the sequence.

Figure 18:
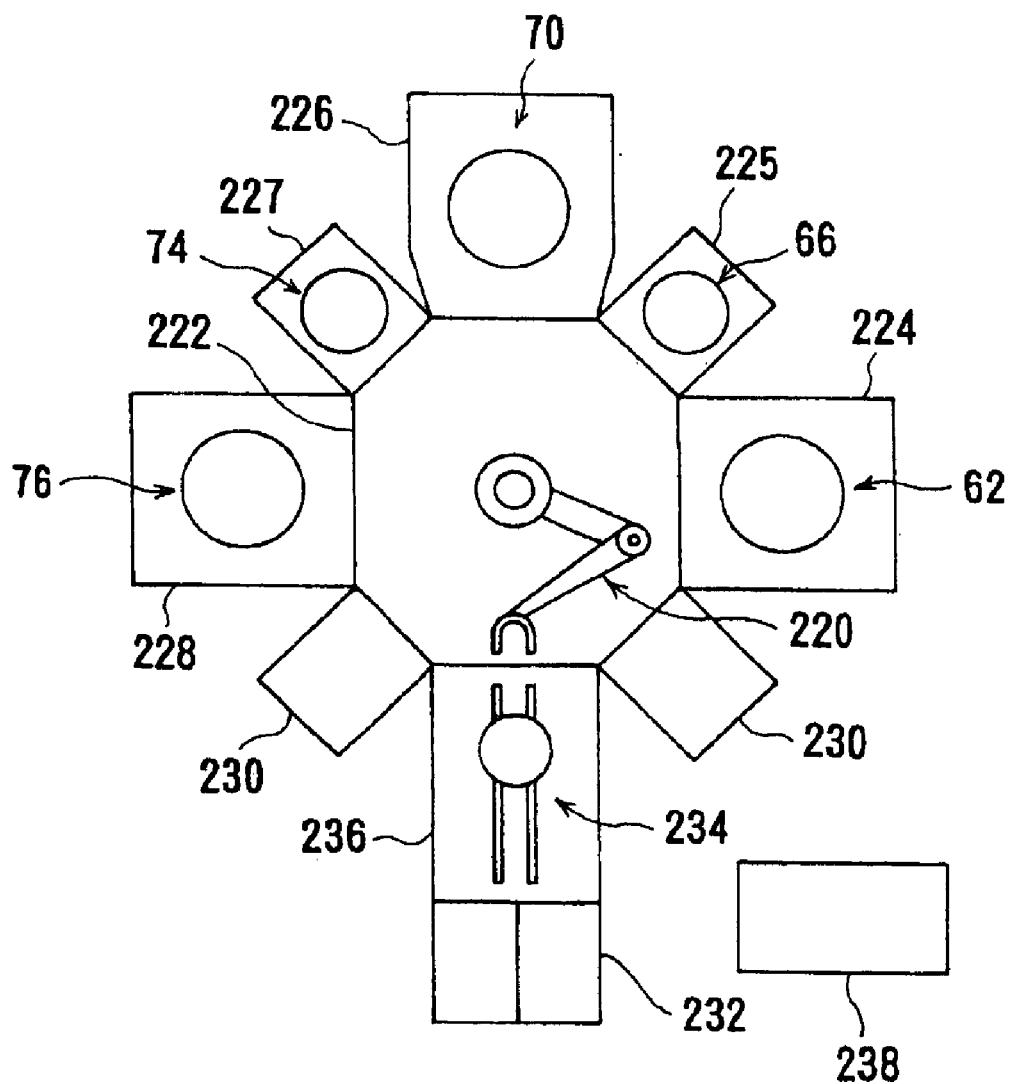
FIG. 18 is a plan view of another apparatus for forming a film according to the present invention.

FIG. 18 shows another example of an apparatus for forming a thin metal film according to the present invention. As shown in FIG. 18, the apparatus for forming a thin metal film comprises a central transfer chamber 222 having a transfer robot 220 disposed therein, a dispersed liquid supply chamber 224 housing the dispersed liquid supply device 62 therein, a supplementary drying chamber 225 housing the supplementary drying device 66 therein, an energy beam applying chamber 226 housing the energy beam applying device 70 therein, an insulating film forming chamber 227 housing the insulating film forming device 74 therein, a polishing chamber 228 housing the polishing device 76 therein, and a plurality of stockyards (temporary placing chambers) 230 disposed in given positions between these chambers. The dispersed liquid supply chamber 224, the supplementary drying chamber 225, the energy beam applying chamber 226, the insulating film forming chamber 227, the polishing chamber 228, and the stockyards 280 are disposed radially around the central transfer chamber 222. The apparatus also has a second transfer chamber 236 having a mobile robot 234 disposed therein, the second transfer chamber 236 being positioned between a loading/unloading chamber 232 and the central transfer chamber 222. The apparatus also has a process managing computer 238 for exchanging operating information between computers thereby to optimize the process as a whole.

With the above apparatus for forming a thin metal film, the dispersed liquid supply chamber 224 housing the dispersed liquid supply device 62 therein, supplementary drying chamber 225 housing the supplementary drying device 66 therein, the energy beam applying chamber 226 housing the energy beam applying device 70 therein, and the other chambers can be constructed as units. Furthermore, various processes including a dispersed liquid supplying process, an energy beam applying process, etc. can be individually performed and can be combined to carry out a process of forming an interconnect.

EXAMPLE 1

Oleic acid was used as an organic anionic substance, and silver acetate was used as a metal source. 0.5 L of a naphthene-based high boiling solvent having a distilling point of 250° C. was placed into an eggplant-shaped flask having a volume of 1 L, and 10 g of silver acetate and 20 g of oleic acid were added to the solvent. The mixture was then heated at 240° C. for 3 hours. As the mixture is heated, its color changed from colorless to light brown to purple. After the mixture was heated, acetone was added to the mixture, and the mixture was then refined by way of precipitation.

The modified powder was observed by a transmissive electron microscope. The observation indicated that the powder was composed of ultrafine metal particles having a diameter of about 10 nm. An X-ray powder diffraction process conducted on the powder confirmed cores of metal silver.

The powder composed of ultrafine particles (ultrafine composite metal particles) was then dispersed in toluene and xylene. No precipitation was recognized in either of the solutions, which appeared to be transparent. In other words, the powder was dissolvable. The dispersed liquid was used as an ultrafine particle dispersed liquid, and applied to a semiconductor substrate according to the above process, thus forming good silver interconnects. The silver interconnects were measured for their resistance, which was 1.8 $\mu\Omega\cdot$cm.

EXAMPLE 2

Stearic acid was used as an organic anionic substance, and copper carbonate was used as a metal source. 0.5 L of a paraffin-based high boiling solvent having a distilling point of 250° C. was placed into an eggplant-shaped flask having a volume of 1 L, and 10 g of copper carbonate and 40 g of stearic acid were added to the solvent. The mixture was then heated at 300° C. for 3 hours. As the mixture was heated, its color changed from light green to dark green to brown. After the mixture was heated, methanol was added to the mixture, and the mixture was then refined by way of precipitation. The powder composed of ultrafine particles (ultrafine composite metal particles) was then applied to a substrate in the same manner as with Example 1. As a result, good copper interconnects were formed.

EXAMPLE 3

Sodium dodecylbenzenesulfonate was used as an organic anionic substance, and chloroauric acid was used as a metal source. 0.5 L of xylene (isomer mixture) was placed into an eggplant-shaped flask having a volume of 1 L, and 5 of chloroauric acid and 20 g of sodium dodecylbenzenesulfonate were added to the solvent. The mixture was then heated at 150° C. for 3 hours. As the mixture was heated, its color changed from yellow to light brown to red. After the mixture was heated, acetone was added to the mixture, and the mixture was then refined by way of precipitation.

The powder composed of ultrafine particles (ultrafine composite metal particles) was then applied to a substrate in the same manner as with Example 1. As a result, good gold interconnects were formed.

EXAMPLE 4

Ultrafine silver particles produced by a vacuum evaporation process and silver naphthenate were dispersed in terpineol, producing a dispersed liquid containing 5 wt % of metal. Then, a silicon substrate was set in a spin coater, and rotated at 450 rpm. The dispersed liquid of ultrafine silver particles described above was dropped onto the rotating silicon substrate to perform spin-coating, forming a dispersed liquid film on the surface of the substrate. The substrate was then heated at 150° C. for 60 minutes in the atmosphere, evaporating the organic solvent in the dispersed liquid film thereby to form a coating layer on the surface of the substrate. The coating layer on the surface of the substrate was then irradiated with an electron beam under 70 kV for 60 seconds in a flow of $N_2$, thus forming a thin silver film from which the organic substance was removed.

EXAMPLE 5

Copper naphthenate was dispersed in a toluene, producing a dispersed liquid containing 5 wt % of metal. Then, a silicon substrate was set in a spin coater, and rotated at 450 rpm. The dispersed liquid described above was dropped onto the rotating silicon substrate to perform spin-coating, forming a dispersed liquid film on the surface of the substrate. The substrate was then heated at 100° C. for 30 minutes in the atmosphere, evaporating the organic solvent in the dispersed liquid film thereby to form a coating layer on the surface of the substrate. The coating layer on the surface of the substrate was then irradiated with an electron beam under 70 kV for 60 seconds in a flow of $N_2$, thus forming a thin copper film from which the organic substance was removed.

EXAMPLE 6

Copper naphthenate and copper powder were dispersed in a toluene, producing a dispersed liquid containing 5 wt % of metal. A thin copper film was then formed in the same manner as with Example 2.

EXAMPLE 7

Ultrafine silver particles produced by a vacuum evaporation process, copper naphthenate, and silver powder were dispersed in terpineol, producing a dispersed liquid containing 50 wt % of metal. Then, a silicon substrate was set in a screen printing press, and coated (printed) on its surface with the dispersed liquid of ultrafine silver particles, forming a dispersed liquid film on the surface of the substrate. The substrate was then heated at 150° C. for 60 minutes in the atmosphere, evaporating the organic solvent in the dispersed liquid film thereby to form a coating layer having a thickness of 10 μm. The coating layer on the surface of the substrate was then irradiated with an electron beam under 70 kV for 120 seconds in a flow of $N_2$, thus forming a thin silver film having a thickness of 5 μm from which the organic substance was removed.

EXAMPLE 8

Ultrafine silver particles produced by a vacuum evaporation process were dispersed in terpineol, producing a dispersed liquid containing 15 wt % of ultrafine silver particles having an average diameter of 5 nm. Then, the via holes in a silicon substrate were treated by the dispersed liquid of ultrafine silver particles. The substrate had an insulating layer of $SiO_2$ with via holes having a diameter of 0.15 μm (aspect ratio of 5) defined therein. A barrier metal of TaN was deposited to a thickness of 0.02 μm on the surface of the substrate including the inner surfaces of the via holes. Then, the silicon substrate was set in a spin coater, and rotated at 450 rpm. The dispersed liquid of ultrafine silver particles was dropped onto the rotating silicon substrate to perform spin-coating, forming a dispersed liquid film having a thickness of 8 μm on the surface of the substrate. The substrate was then heated at 100° C. for 10 minutes in the atmosphere, evaporating the organic solvent in the dispersed liquid thereby to form a coating layer on the surface of the substrate. The coating layer on the surface of the substrate was then irradiated with an electron beam under 70 kV for 120 seconds in a flow of $N_2$, thus forming a thin silver film filling up the via holes from which the organic substance was removed.

According to the present invention, as described above, it is possible to form a thin metal film of good quality efficiently and stably. The thin metal film used as metal interconnects in highly integrated semiconductor circuits contributes to the progress of a process of fabricating semiconductor devices.

INDUSTRIAL APPLICABILITY

The present invention relates to a method of and an apparatus for forming a thin metal film of copper, silver, or the like on a surface of a semiconductor or another substrate. According to the present invention, it is possible to form a thin metal film of good quality efficiently and stably. The thin metal film used as metal interconnects in highly integrated semiconductor circuits contributes to the progress of a process of fabricating semiconductor devices.

What is claimed is:

1. A method of forming a thin metal film, comprising:

preparing a dispersed liquid having a metal-containing organic compound dispersed in a predetermined solvent;

coating said dispersed liquid on a surface of a substrate and evaporating the solvent to form a coating layer;

applying an energy beam to said coating layer to decompose away an organic substance contained in said coating layer in an area irradiated with the energy beam and to bond metal contained in said coating layer; and dissolving away said metal-containing organic compound left on the surface of the substrate with a solvent.

2. A method of forming a thin metal film according to claim 1, wherein a metal powder is dispersed in said dispersed liquid.

3. A method of forming a thin metal film according to claim 1, wherein said energy beam comprises an electron beam, and is applied in air, an inactive gas, or a vacuum.

4. A semiconductor device having interconnects formed by a method of forming a thin metal film according to claim 1.

5. A method of forming a thin metal film, comprising:

preparing a dispersed liquid having a metal-containing organic compound dispersed in a predetermined solvent;

coating said dispersed liquid on a surface of a substrate and evaporating the solvent to form a coating layer;

applying an energy beam to said coating layer to decompose away an organic substance contained in said coating layer in an area irradiated with the energy beam and bond metal contained in said coating layer to form a metal pattern; and dissolving away said metal-containing organic compound left on the surface of the substrate with a solvent.

6. A method of forming a thin metal film according to claim 5, further comprising:

forming an insulating film on the surface of the substrate; and chemical mechanical polishing the surface of said insulating film.

7. A method of forming a thin metal film according to any one of claims 1, 2, 5 or 6, wherein said metal-containing organic compound comprises ultrafine composite metal particles having a core made substantially of a metal component having an average diameter ranging from 1 to 100 nm and a covering layer of an organic substance chemically bonded to said core, and/or a metal complex.

8. A method of forming a thin metal film according to claim 7, wherein said core made substantially of a metal component has an average diameter ranging from 1 to 20 nm.

* * * * *